US009664755B2

(12) United States Patent
Holm et al.

(10) Patent No.: US 9,664,755 B2
(45) Date of Patent: May 30, 2017

(54) MAGNETIC FIELD SENSOR WITH STRUCTURE FOR RECONDITIONING MAGNETIC POLARIZATION OF FLUX GUIDES

(71) Applicant: FREESCALE SEMICONDUCTOR, INC., Austin, TX (US)

(72) Inventors: Paige M. Holm, Phoenix, AZ (US); Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 457 days.

(21) Appl. No.: 14/160,100

(22) Filed: Jan. 21, 2014

(65) Prior Publication Data

US 2015/0204951 A1    Jul. 23, 2015

(51) Int. Cl.
G01R 33/09    (2006.01)

(52) U.S. Cl.
CPC .................................. *G01R 33/098* (2013.01)

(58) Field of Classification Search
CPC ..................................................... G01R 33/098
USPC ................................................ 324/244, 252
See application file for complete search history.

(56) References Cited

U.S. PATENT DOCUMENTS

| 8,447,556 B2 | 5/2013 | Friedrich et al. |
| 2005/0007106 A1* | 1/2005 | Goldfine ............ G01N 27/9046 324/228 |
| 2011/0074406 A1 | 3/2011 | Mather et al. |
| 2012/0293164 A1 | 11/2012 | Liou et al. |
| 2013/0221949 A1 | 8/2013 | Liu et al. |
| 2013/0300402 A1* | 11/2013 | Liu .................. G01R 33/09 324/202 |
| 2015/0028863 A1* | 1/2015 | Zeyen ................ G01R 33/0052 324/244 |

OTHER PUBLICATIONS

Bosch Sensortec, "Data Sheet BMM150 Geomagnetic Sensor" Apr. 25, 2013, pp. 1-56.
Robert Racz et al., "Electronic Compass Sensor", Institute of Electrical and Electronics Engineers (IEEE), 2004, pp. 1446-1449, Switzerland.

* cited by examiner

*Primary Examiner* — Jay Patidar
(74) *Attorney, Agent, or Firm* — Charlene R. Jacobsen

(57) ABSTRACT

A sensor package includes a magnetic field sensor, where the magnetic field sensor includes an in-plane sense element and a flux guide configured to direct a magnetic field oriented perpendicular to a plane of the magnetic field sensor into the plane. A current carrying structure is positioned proximate the flux guide and circuitry is coupled to the current carrying structure. The current carrying structure includes a continuous coil having multiple substantially parallel conductive segments connected by additional conductive segments oriented Perpendicular to the parallel conductive segments to form a continuous series of loops. The circuitry is configured to provide an electric current to the continuous coil such that the electric current flows through each of the parallel conductive segments, wherein the electric current generates a magnetic field, and the magnetic field is applied to the flux guide to recondition a magnetic polarization of the flux guide.

9 Claims, 6 Drawing Sheets

MAGNETIC FIELD SENSOR WITH STRUCTURE FOR RECONDITIONING MAGNETIC POLARIZATION OF FLUX GUIDES

TECHNICAL FIELD OF THE INVENTION

Embodiments of the present invention relate generally to magnetoelectronic devices. More specifically, the present invention relates to a magnetic field sensor used to sense magnetic fields.

BACKGROUND OF THE INVENTION

Magnetic field sensors are widely used in a number of applications including in, for example, compass, security, and military applications, geophysics and space research, biomagnetism and medical applications, and non-destructive testing. Magnetic field sensors are typically based on semiconductor materials (e.g., Hall sensors, semiconductor magnetoresistors, and so forth) and ferromagnetic materials (e.g., ferromagnetic magnetoresistors and flux guides). Other magnetic sensors utilize optical, resonant, and superconducting properties.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

Figure 1:
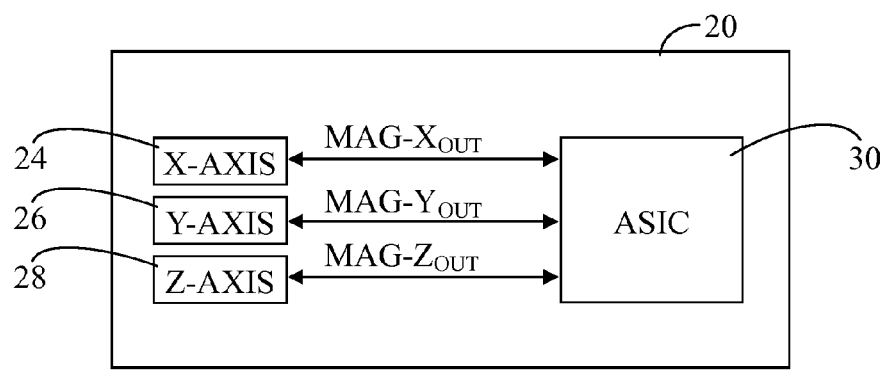
FIG. 1 shows a simplified block diagram of an apparatus that includes a magnetic field sensor.

FIG. 1 shows a simplified block diagram of a sensor package 20. Sensor package 20 may be implemented in any device or system in which magnetic field sensing is required, for example, in compass, security, and military applications, in geophysics and space research applications, in biomagnetism and medical applications, and/or in non-destructive testing. In this example, sensor package 20 may be adapted to sense a magnetic field along three axes. Hence, sensor package 20 includes an X-axis magnetic field sensor 24, a Y-axis magnetic field sensor 26, and a Z-axis magnetic field sensor 28. Magnetic field sensors 24, 26, 28 may be coupled to, or otherwise in communication with, an application specific integrated circuit (ASIC) 30 to form sensor package 20. ASIC 30 performs some or all functions including, but not limited to, signal conditioning and data management, reset and stabilization control, bridge/output multiplexing, self-test, electrostatic discharge (ESD) protection, and so forth.

In an exemplary configuration, magnetic field sensors 24, 26, 28 may be magnetic tunnel junction (MTJ) sensors. An MTJ structure includes a metal-insulator-metal layer sandwich in which the metal layers are ferromagnetic and the insulator layer is very thin. Electrically, this forms a tunnel diode in which electrons can tunnel from one ferromagnet into the other. Such a tunnel diode exhibits transport characteristics that depend, not only on the voltage bias, but also on the magnetic states of the top and bottom electrodes.

At a fixed voltage bias, the resistance of the junction depends upon the alignment of the magnetic moments of the electrodes. In general, when the moments of the two layers are parallel, the resistance of the junction is lowest. When the moments are anti-parallel, the resistance of the junction is highest. And in between, the resistance of the junction varies as the cosine of the angle between moments. In a magnetic field sensor application, the magnetic orientation of one of the ferromagnetic layers is fixed, or "pinned," in a certain direction, while the sense ferromagnetic layer is "free" to follow the orientation of the applied magnetic field which modulates the measured resistance. The MTJ resistors may be assembled into a conventional Wheatstone bridge configuration to form the sensor for sensing an external magnetic field. Sensor package 20 may include three Wheatstone bridge structures (one for each axis).

Figure 2:
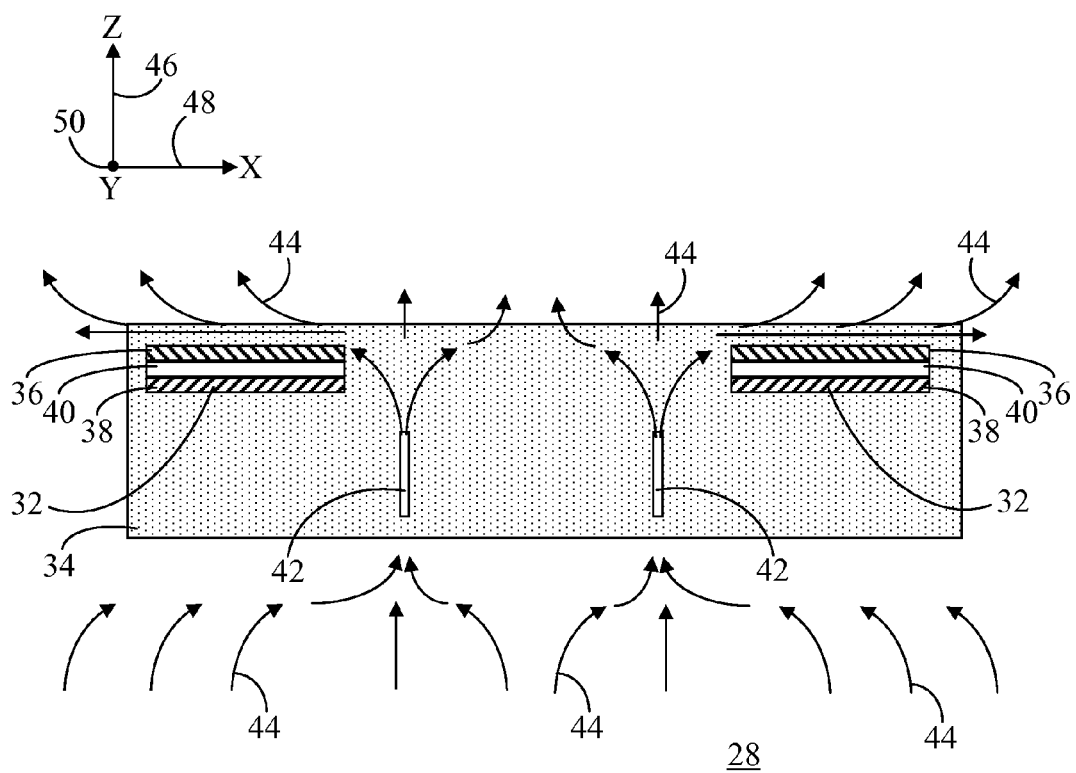
FIG. 2 shows a simplified side view of a Z-axis magnetic field sensor.

FIG. 2 shows a simplified side view of a pair of Z-axis sense elements 32 of Z-axis magnetic field sensor 28 formed within a dielectric material 34. Z-axis sense elements 32 are MTJ structures, each of which includes ferromagnetic layers 36, 38 separated by insulator layer 40. Z-axis magnetic field sensor 28 may include any quantity of Z-axis sense elements 32 in accordance with particular design parameters. Some of the figures are illustrated using various shading and/or hatching to distinguish the different elements produced within the structural layers of Z-axis sense elements 32. These different elements within the structural layers may be produced utilizing current and upcoming micromachining techniques of depositing, patterning, etching, and so forth. Accordingly, although different shading and/or hatching is utilized in the illustrations, the different elements within the structural layers may be formed out of the same material.

In order to sense the magnetic field in a direction perpendicular to the plane of substrate 34, flux guides 42 are also formed within dielectric material 34. Flux guides 42 can be used to guide a Z-axis magnetic field 44 (represented by arrows) into the X-Y plane. Flux guides 42 are shaped magnetic material typically used to guide flux, i.e., Z-axis magnetic field 44, to a preferred location. With the use of flux guides 42 incorporated into Z-axis magnetic field sensor 28, Z-axis magnetic field 44 is suitably guided so that it can be sensed by one of the Wheatstone bridge structures (not shown) from in-plane sensing elements (i.e., Z-axis sense elements 32). In this side view illustration, a Z-axis 46 is oriented up-and-down on the page, an X-axis 48 is oriented right-and-left on the page, and a Y-axis 50 is represented as a dot that depicts an axis going either into or out of the page on which FIG. 2 is situated. Accordingly, the X-Y plane in this side view illustration is oriented right-and-left and into or out of the page.

Figure 3:
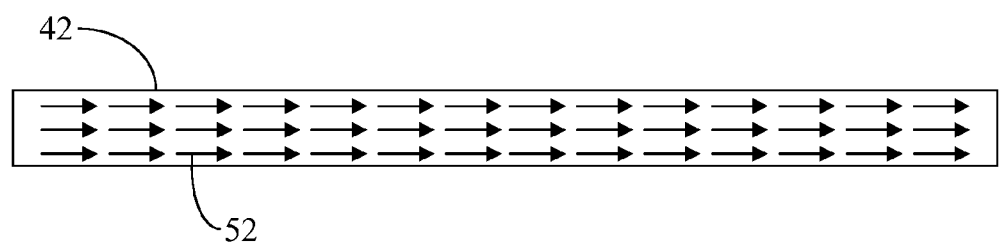
FIG. 3 shows a side view of a flux guide for a Z-axis magnetic field sensor exemplifying a magnetic polarization having a baseline orientation.

FIG. 3 shows a side view of one of flux guides 42 for Z-axis magnetic field sensor 28 (FIG. 2) exemplifying a magnetic polarization 52 having a baseline, or stable, orientation. For optimal Z axis response, flux guides 42 have a preferred magnetization orientation. That is, magnetic polarization 52 for each of flux guides 42 will be directed in a uniform, i.e., generally single, direction. Unfortunately, flux guides 42 are susceptible to corruption by exposure to externally applied magnetic fields (e.g., disturbing fields of approximately one hundred Gauss or more). This corruption can alter the magnetic state of flux guides 42 leading to unstable device characteristics including offset, axis alignment, and noise.

Figure 4:
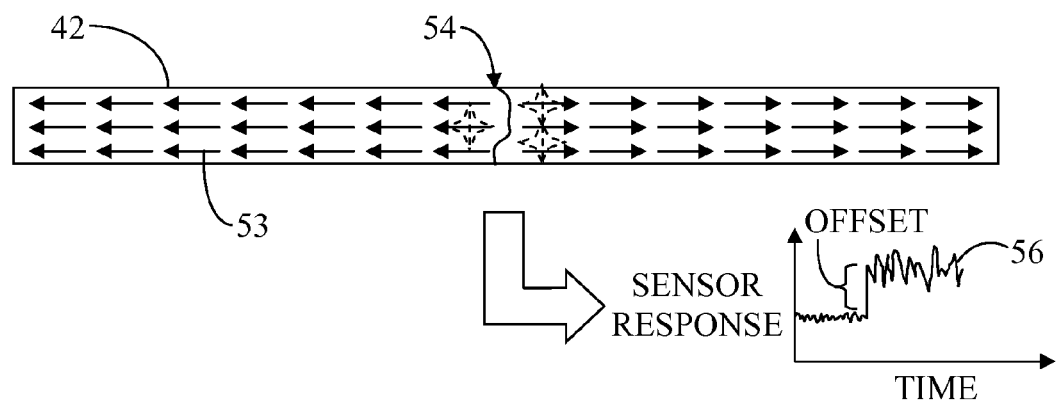
FIG. 4 shows a side view of the flux guide exemplifying a magnetic polarization having an unstable orientation.

FIG. 4 shows a side view of one of flux guides 42 for Z-axis magnetic field sensor 28 exemplifying magnetic polarization 53 having an unstable orientation. That is, FIG. 4 is provided to show the altered magnetic state of flux guide 42 in response to exposure to an externally applied magnetic field of sufficient strength. Exposure to an externally applied magnetic field in a particular orientation can reorient magnetic polarization 52 (FIG. 3) of flux guide 42 so that upon returning to its low field sensing configuration, magnetic domain walls 54 (one shown) may be present in flux guides 42. As exemplified in FIG. 4, magnetic domain walls 54 are regions in flux guide 42 at which magnetic polarization 53 points in different directions.

The presence of one or more magnetic domain walls 54 results in non-uniformity in magnetic polarization 53. Furthermore, domain walls 54 may travel up and down the length of flux guides 42, thereby modulating the local field at Z-axis sense elements 32 (FIG. 2), or magnetic domains near domain walls 54 may become unstable leading to elevated noise levels above the lowest possible minimum. This noise may lower the signal-to-noise ratio (SNR) during measurements of Z-axis magnetic field 44 resulting in a noisy response 56 that is detectable by Z-axis sense elements 32 (FIG. 2). Exemplary embodiments described below recondition flux guides 42 by re-setting their magnetic orientations to the baseline, stable configuration of magnetic polarization 52 as exemplified in FIG. 3 by eliminating these magnetic domain walls 54 after being corrupted by an external disturbing field.

Figure 5:
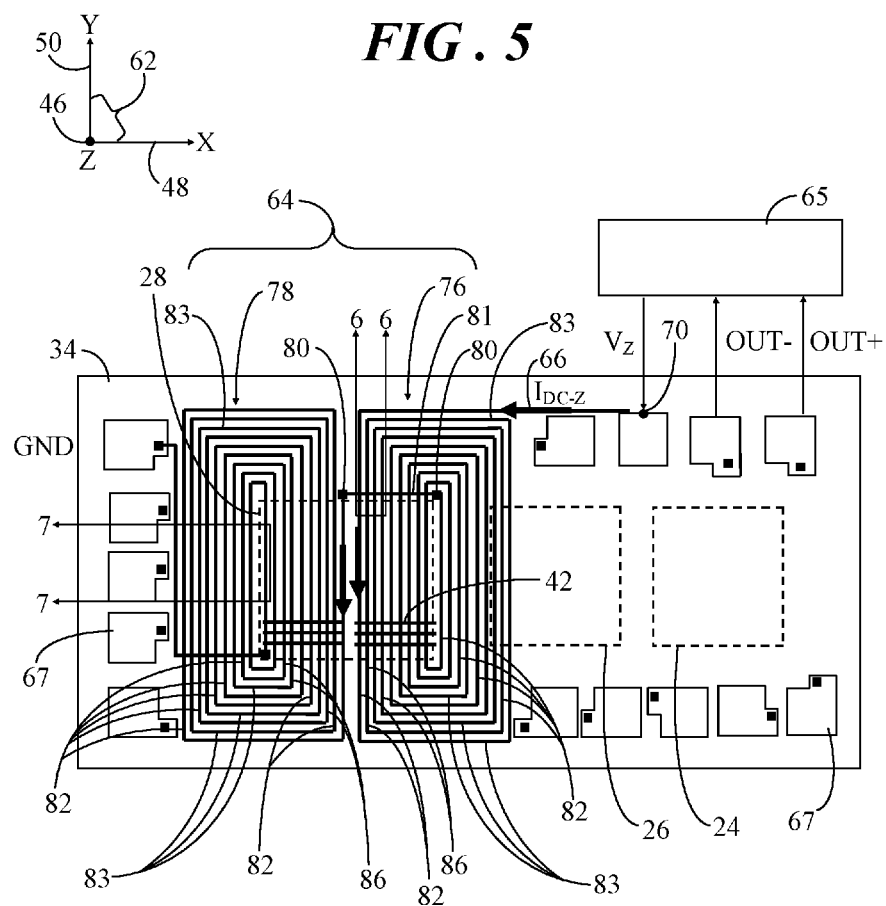
FIG. 5 shows a top view of a sensor package in accordance with an embodiment.
Figure 6:
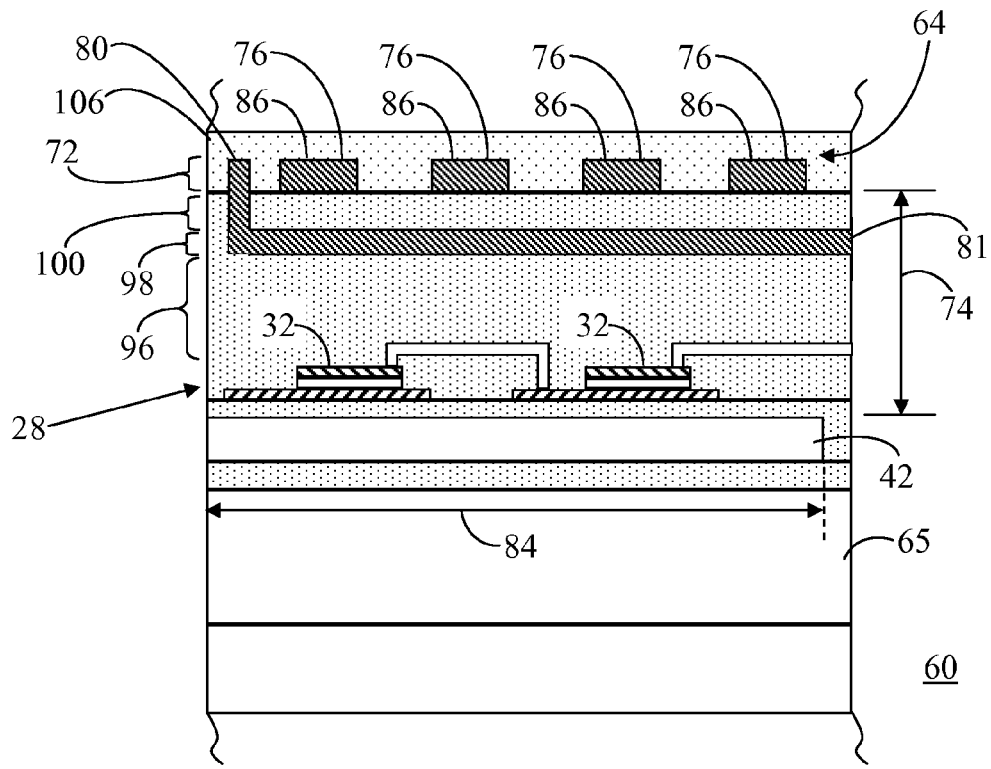
FIG. 6 shows a partial side view of the sensor package along section lines 6-6 of FIG. 5.
Figure 7:
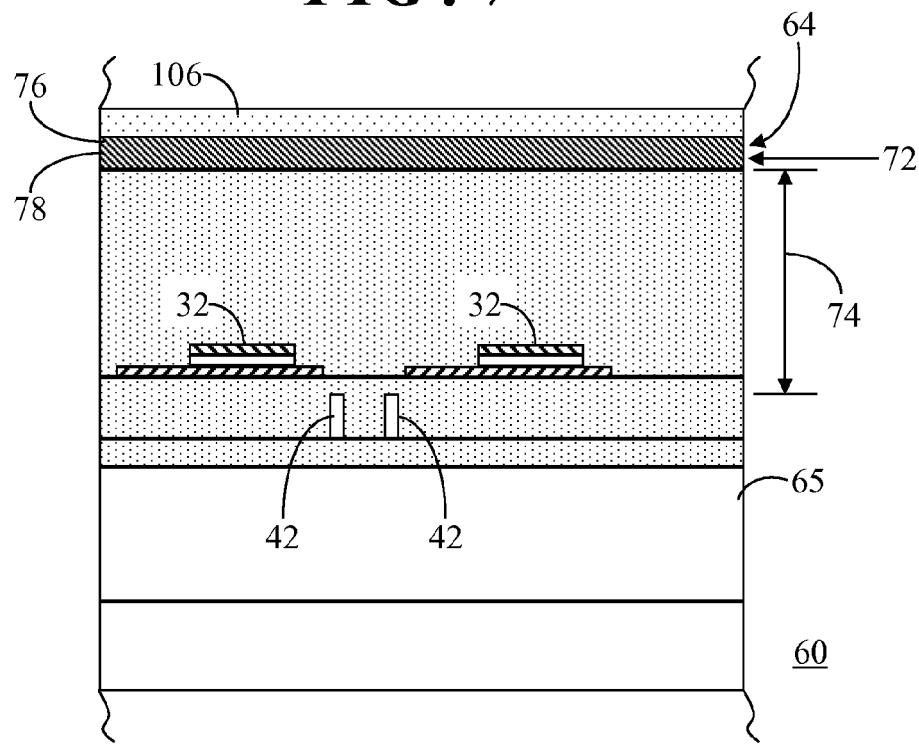
FIG. 7 shows a partial side view of sensor package along section lines 7-7 of FIG. 5.

Referring to FIGS. 5-7, FIG. 5 shows a top view of a sensor package 60 in accordance with an embodiment. FIG. 6 shows a partial side view of sensor package 60 along section lines 6-6 of FIG. 5, and FIG. 7 shows a partial side view of sensor package along section lines 7-7 of FIG. 5. Sensor package 60 includes Z-axis magnetic field sensor 28 (shown in dashed line form in FIG. 5). Sensor package 60 may additionally include X-axis magnetic field sensor 24 and/or Y-axis magnetic field sensor 26 (also shown in dashed line form in FIG. 5). As discussed previously, in order to sense Z-axis magnetic field (FIG. 2) oriented perpendicular to an X-Y plane 62 of sensor package 60, Z-axis magnetic field sensor 28 includes flux guides 42 (FIGS. 6 and 7) configured to direct Z-axis magnetic field 44 (FIG. 2) into X-Y plane 62. In the top view illustration of FIG. 5, X-Y plane 62 is oriented up-and-down and right-and-left on the page on which FIG. 5 is situated.

In accordance with an embodiment, sensor package 60 further includes a current carrying structure, in the form of a continuous coil structure 64, positioned proximate flux guides 42. Circuitry 65 in the form of an application specific integrated circuit (ASIC), is coupled to continuous coil structure 64. In some embodiments, circuitry 65 may be a CMOS (complementary metal-oxide-semiconductor) integrated circuit with sensor package 60 formed thereon or otherwise attached thereto to yield a sensor package on CMOS wafer structure. Sensor package 60 may further include a plurality of bond pads 67 that may be utilized to electrically interconnect sensor package 60 with circuitry 65, to ground, and/or with external devices (not shown) in accordance with a particular package design.

Circuitry 65 is configured to apply a direct current (DC) electric current 66, $I_{DC-Z}$, to an input 70, at one of bond pads 67, of continuous coil structure 64. As will be discussed in connection with FIG. 9, electric current 66 generates a magnetic field, and a vector component of the magnetic field is applied to flux guides 42 in order to eliminate any domain walls 54 (FIG. 4) in magnetic polarization 53 (FIG. 4) of flux guides 42 and thereby generate the stable, baseline, magnetic polarization 52 shown in FIG. 3. Of course, circuitry 65 may additionally perform some or all functions including, but not limited to, signal conditioning and data management, reset and stabilization control, bridge/output multiplexing, self-test, electrostatic discharge (ESD) protection, and so forth.

Electric current 66 is a non-pulsed or pulsed electric current configured to generate a magnetic field such that the vector component of the magnetic field in a direction substantially parallel to a length of flux guides 42 exceeds a minimum threshold level of magnetic flux density, referred to herein as a reconditioning threshold. In some embodiments, the reconditioning threshold of magnetic flux density may be approximately thirty Gauss. In other embodiments, the reconditioning threshold may be approximately one hundred Gauss. And in still other embodiments, the reconditioning threshold may be somewhere between approximately thirty and approximately one hundred Gauss. The reconditioning threshold may be less than thirty Gauss and more than one hundred Gauss in still other embodiments. In addition, when a flow of electric current 66 through continuous coil structure 64 reaches steady state, the magnetic field is applied concurrently to an entire length of flux guides 42 in order to recondition magnetic polarization 53 (FIG. 4) of flux guides 42 to produce the stable, baseline, magnetic polarization 52 (FIG. 3).

Continuous coil structure 64 is formed in at least one structural layer 72 vertically displaced (in the orientation of FIGS. 7 and 8) from flux guides 42 of Z-axis magnetic field sensors 28. In some embodiments, continuous coil structure 64 may be positioned within a distance 74 of approximately five microns from flux guides 42, although distance 74 may be larger or smaller, as well.

In the illustrated embodiment, continuous coil structure 64 of sensor package 60 includes two continuous spiral coils, referred to herein as a continuous coil 76 and a continuous coil 78, positioned adjacent to flux guides 42 of Z-axis magnetic field sensors 28. Continuous coils 76, 78 are connected in series and are formed in the same, i.e., a common, structural layer 72 that is vertically displaced from flux guides 42 (in the orientation of FIGS. 7 and 8). Continuous coils 76, 78 may be connected in series by vias 80 that are in turn connected to a conductive trace 81 (shown in FIGS. 5 and 6) formed in another structural layer of sensor package 60 in accordance with known methodologies.

Each of continuous coils 76, 78 includes a plurality of conductive segments 82 (i.e., traces or runners) extending parallel to Y-axis 50 that are arranged adjacent to and substantially parallel to one another. Additionally, these conductive segments 82 are oriented substantially perpendicular to a length 84 (best seen in FIG. 6) of flux guides 42. Conductive segments 82 within each coil 76, 78 are connected by additional conductive segments 83 extending parallel to X-axis 48. For purposes of illustration, a few flux guides 42 are also shown in FIG. 5 to illustrate the perpendicular orientation of conductive segments 82 relative to flux guides 42. Although not illustrated for clarity, sensor package includes more than the illustrated number of flux guides 42 positioned parallel to X-axis 48 in a manner similar to the illustrated flux guides 42.

In accordance with an embodiment, each of conductive segments 82 overlying and oriented perpendicular to flux guides 42 are configured such that the flow of electric current 66 through those conductive segments 82 is in the same direction. Accordingly, each of continuous coils 76, 78 includes a subset 86 of conductive segments 82 for which electric current 66 flows in the same direction in accordance with their particular coil winding (as denoted by downwardly directed arrows overlying one conductive segment 82 from each of subsets 86). The conductive segments 82 that are not overlying flux guides 42 also are configured such that the flow of electric current 66 through those conductive segments 82 is in the same direction. However, the direction of flow generally is opposite the direction of the flow of electric current 66 through subset 86 of conductive segments 82. That is, subset 86 of conductive segments 82 generally includes one half of each set of conductive segments 82 for each of coils 76, 78 (i.e., the half of conductive segments 82 that overlies flux guides 42).

In the illustrated embodiment, continuous coil structure 64 includes two adjacent coils 76, 78 of which approximately half of conductive segments 82 (i.e., subset 86 of conductive segments 82) is used to recondition flux guides 42. Such a configuration may be implemented as an adjunct or enhancement to a pre-existing sensor package in which Z-axis magnetic field sensor 28 has a fixed and known configuration of Z-axis sense elements 32 and flux guides 42. The use of two adjacent coils 76, 78 may serve to mitigate an adverse impact to the size of sensor package 60 when implementing continuous coil structure 64 in a pre-existing Z-axis magnetic field sensor 28 design. It should be understood, however, that alternative embodiments may include continuous coil structure 64 having a single continuous coil or more than two continuous coils in accordance with a particular design configuration of Z-axis sense elements 32 and flux guides 42.

Figure 8:
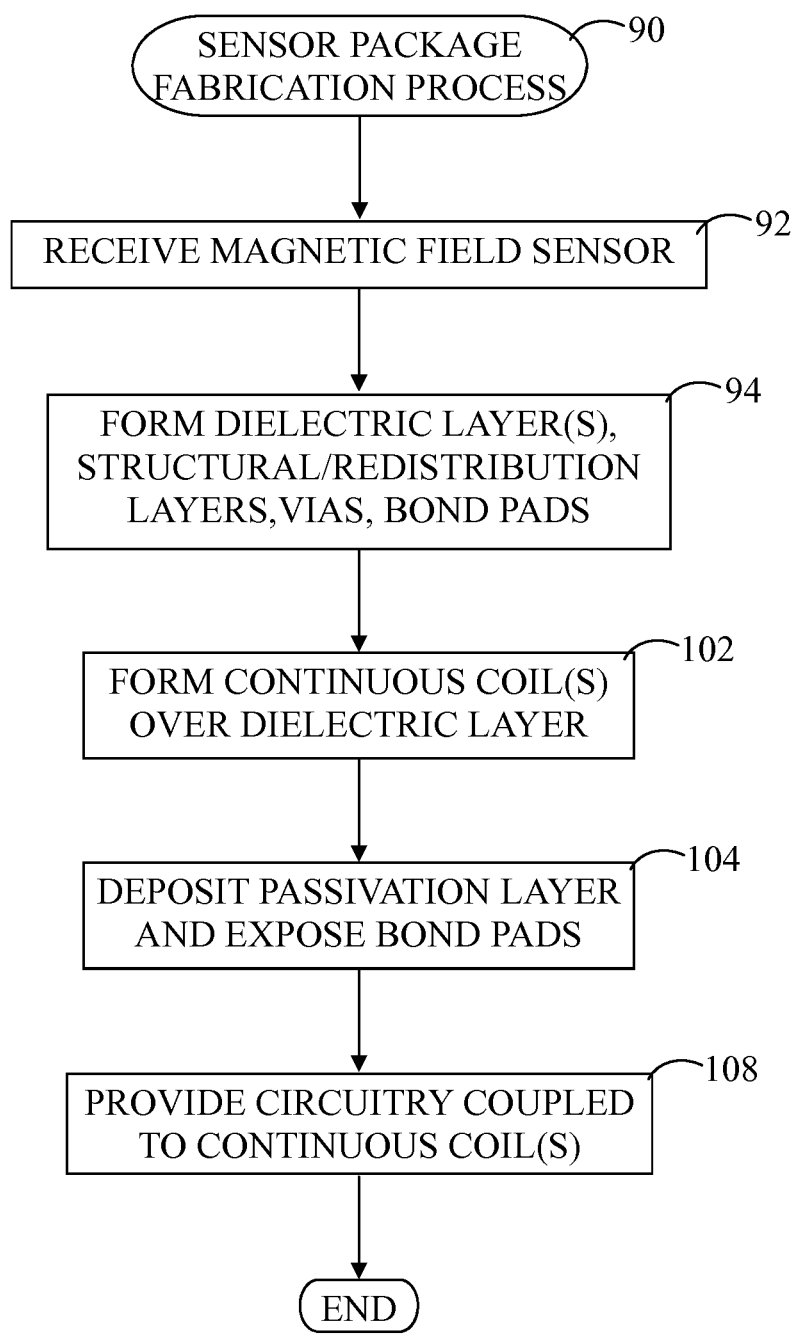
FIG. 8 shows a magnetometer fabrication process in accordance with an embodiment.

FIG. 8 shows a sensor package fabrication process 90 in accordance with an embodiment. Sensor package fabrication process 90 may be executed to incorporate continuous coil structure 64 to an existing Z-axis magnetic field sensor 28 design or to incorporate continuous coil structure 64 into a new Z-axis magnetic field sensor design.

Sensor package fabrication process 90 begins with a task 92. At task 92, the magnetic field sensor components are received. The magnetic field sensor components may be received as a single wafer having a plurality of magnetic field sensors formed thereon in accordance with known and upcoming methodologies. The wafer may be received from another manufacturing facility that originally fabricated the wafer. Alternatively, the wafer, containing the magnetic field sensors, may be fabricated at the same facility that is also performing the post-fabrication activities described below. The magnetic field sensor components includes those elements and layers used to form the metal-insulator-metal layer sandwich of an MTJ structure for the magnetic field sensors to be included within a particular sensor package, such as sensor package 60 having X-axis magnetic field sensor 24, Y-axis magnetic field sensor 26, and Z-axis magnetic field sensor 28.

Following task 92, process 90 continues with a task 94. At task 94, dielectric layers, intervening structural/redistribution layers, vias, and bond pads may be formed in accordance with a particular sensor package design. By way of example and with reference to FIG. 6, a dielectric layer 96 may be deposited over Z-axis magnetic field sensor 28 and a metal layer 98 may be deposited over dielectric layer 96. Dielectric layer 96 and metal layer 98 may be suitably patterned, etched, and so forth to produce, for example one or more conductive traces (for example, conductive trace 82 shown in FIG. 6), additional structures in accordance with a particular design, conductive vias (not shown) extending through dielectric layer 96, and so forth. Another dielectric layer 100 may be deposited over metal layer 98 and conductive vias, such as conductive vias 80 may be formed extending through dielectric layer 100 in accordance with a particular design. Metal layer 98, dielectric layers 96, 100, and the vias may be formed to interconnect the individual continuous coils 76, 78 (FIG. 5), to redistribute and interconnect newly formed bond pads 67 with the underlying bond pads (not shown) of an existing sensor package design, and so forth.

Referring back to FIG. 8, following task 94, sensor package fabrication process 90 continues with a task 102. At task 102, continuous coil structure 64 that includes, for example, continuous coils 76, 78 (FIG. 5) is formed over the topmost dielectric layer 100 using conventional deposition, patterning, and etching techniques of structural layer 72. Referring to FIG. 5, forming task 102 entails producing the plurality of conductive segments 82 of each of coils 76, 78 that are arranged substantially adjacent and parallel to one another, and are oriented substantially perpendicular to length 84 (FIG. 6) of flux guides 42. Furthermore, conductive segments 82 of continuous coils 76, 78 are produced to include subsets 86 of adjacent conductive segments 82 for which electric current 66 flows in the same direction, and these subsets 86 are placed in overlying relationship with flux guides 42. Thus, continuous coil structure 64 is formed in a structural layer 72 that is vertically displaced from the underlying flux guides 42.

A task 104 is performed following task 102. At task 104, a passivation layer 106 (see FIGS. 6 and 7) is formed over continuous coil structure 64. Passivation layer 106 may be a protective material, such as an oxide, that protects sensor package 60 (FIG. 5) from corrosion and/or other external environmental conditions. In addition, bond pads 67 (FIG. 5) may be exposed from passivation layer 106 at task 104 in accordance with known methodologies so that bond pads 67 may be connected with external devices and circuits, such as circuitry 65 (FIG. 5).

Following task 104, a task 108 may be performed. At task 108, circuitry 65 (FIG. 5) is provided and is coupled to at least continuous coil structure 64 via one or more of the exposed bond pads 67. Sensor package fabrication process 90 may continue with additional operations such as testing, wafer dicing, and so forth not shown herein for brevity. Thereafter, sensor package fabrication process 90 ends.

Accordingly, continuous coil structure 64 may be processed over the top of a sensor package on CMOS wafer to allow implementation of continuous coil structure 64 on either existing magnetic field sensor wafers or within new magnetic field sensor designs. The magnetic field directly under the runners, i.e., conductive segments 82, on one side of each of coils 76, 78 of continuous coil structure 64 can be used to "clean," i.e., recondition, the magnetic polarization of flux guides 42. Continuous coil structure 64 can be positioned within four to five microns (or larger or smaller distances) above flux guides 42 for providing sufficiently high and uniform field to recondition flux guides 42 with sufficiently low current drive to minimize the size of the switching transistor need within circuitry 65.

Furthermore, the width, spacing, number of turns, and number of layers of conductive segments 82 of continuous coil structure 64 can be designed to provide sufficient field uniformity along with total coil resistance that allows a drive, e.g., electric current 66 from, for example, a three volt power supply while still fitting within existing die dimensions. The number of conductive segments 82 is selected to ensure that the entire length of flux guides 42 may be reconditioned (e.g., based on the length of flux guides 42, the vertical displacement between flux guides 42 and conductive segments 82, the magnitude of current 66 through conductive segments 82 (or the desired magnetic flux density magnitude of vector components of a magnetic field generated in response to current 66). In addition, in other embodiments, the parallel conductive segments 82 overlying flux guides 42 may be interconnected in a manner other than as a coil structure (e.g., first ends of each of the parallel conductive segments may be coupled to a first nodes, and second ends of each of the parallel conductive segments be coupled to a second node, where the reconditioning current flows through the conductive segments between the first and second nodes).

Figure 9:
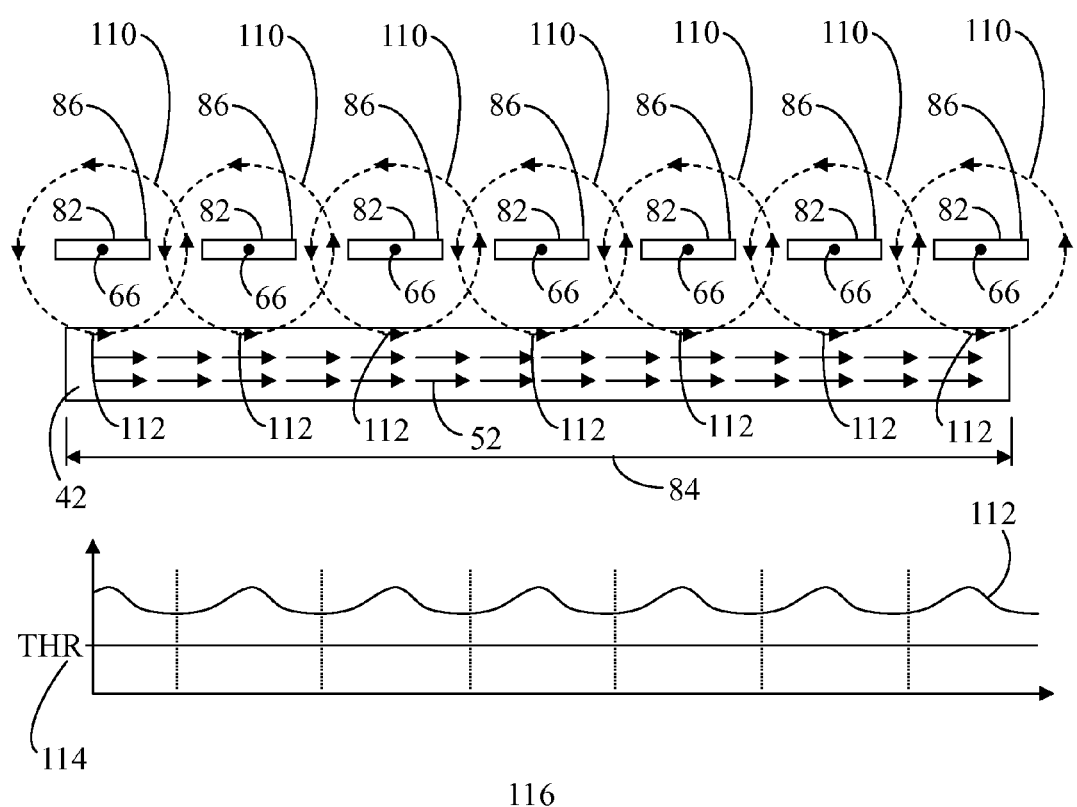
FIG. 9 shows a side view of the flux guide exemplifying reconditioning of the magnetic polarization in accordance with another embodiment.

Referring now to FIG. 9, FIG. 9 shows a side view of flux guide 42 exemplifying reconditioning the magnetic polarization of flux guide in accordance with another embodiment. FIG. 9 also shows a chart 116, in which the X-axis represents the distance (from left to right) along flux guide 42, and the Y-axis represents the magnetic flux density magnitude of vector components 112. A method of reconditioning flux guides 42 (FIG. 2) in Z-axis magnetic field sensor 28 (FIG. 2) of sensor package entails providing continuous coil structure 64 (FIG. 5) positioned proximate to flux guides 42 and providing DC electric current 66 at an input 70 (FIG. 5) of continuous coil structure 64. In FIG. 9, electric current 66 is represented by a dot in each segment 82 of subset of segments 86, and is directed outwardly from the page on which FIG. 9 is drawn.

Electric current 66 generates a magnetic field 110 about each conductive segment 82 in the subset 86 of conductive segments 82, and electric current 66 flows the same direction for each segment 82 within subset 86. For simplicity, magnetic fields 110 are represented by dashed line circles about each segment 82. Arrows are drawn overlying the dashed line circles to represent the general direction of the generated magnetic fields 110. DC electric current 66 may be driven through continuous coil structure 64 in order to generate magnetic field 110 having a vector component 112 parallel to length 84 of flux guides 42. Additionally, electric current 66 should be provided for a duration sufficient to enable the flow through continuous coil structure to become steady state, i.e., non-varying with respect to time. As such, when a flow of electric current 66 through continuous coil structure 64, and in particular through segments 82 within subset 86, reaches steady state, vector components 112 of magnetic field 110 are applied concurrently to an entirety of length 84 of flux guide 42.

Vector components 112 should meet or exceed a minimum threshold level of magnetic flux density, i.e., a reconditioning threshold 114 (THR), sufficient to recondition, i.e., "clean," magnetic polarization of flux guides 42 to produce the stable, baseline, magnetic polarization 52. In FIG. 9, vector components 112 are represented within magnetic fields 110 by arrows that are oriented substantially parallel to length 84 of field guide 42. Of course, regardless of the particular, instantaneous direction of magnetic fields 110, it is vector components 112 parallel to length 84 of field guide 42, at or above reconditioning threshold 114, that are capable of reconditioning magnetic polarization 52. Accordingly, vector components 112 are also illustrated in a chart 116 in FIG. 9 along with reconditioning threshold 114 to emphasize that the magnetic flux density of vector components 112 must meet or exceed a minimum threshold level of magnetic flux density, i.e., reconditioning threshold 114 in order to effectively recondition magnetic polarization in flux guide 42. Reconditioning threshold 114 may be at least thirty Gauss, but may be as high as one hundred Gauss in order to purge flux guides 42 of magnetic defects, such as domain walls 54 (FIG. 6), that may be present in flux guides 42.

After magnetic polarization 52 of flux guides 42 are reconditioned to purge domain walls 54 (FIG. 4) and other defects, circuitry 65 may discontinue the provision of electric current 66, and Z-axis magnetic field sensor 28 (FIG. 5) within sensor package 60 (FIG. 5) may be utilized to sense Z-axis magnetic field 44 (FIG. 2). This reconditioning methodology could be arranged to occur on a fixed schedule (e.g., at a set time each day, week, month, etc.) or periodically when appropriate, and/or automatically when the software operating the sensor package 60 (FIG. 5) detects a problem with or a change in sensor characteristics, or "on-demand" as initiated by a user of the system employing sensor package 60. Each of these modes would call for circuitry 65 (FIG. 5) to provide current 66 for reconditioning.

It is to be understood that certain ones of the process blocks depicted in FIG. 8 may be performed in parallel with each other or with performing other processes. In addition, it is to be understood that the particular ordering of the process blocks depicted in FIG. 8 may be modified, while achieving substantially the same result. Accordingly, such modifications are intended to be included within the scope of the inventive subject matter. In addition, although particular system configurations are described in conjunction with FIGS. 5-7, above, embodiments may be implemented in systems having other architectures, as well. These and other variations are intended to be included within the scope of the inventive subject matter.

Thus, various embodiments of a sensor package, method of fabrication, and method of operation have been described. An embodiment of a sensor package comprises a magnetic field sensor, the magnetic field sensor including an in-plane sense element and a flux guide configured to direct a magnetic field oriented perpendicular to a plane of the sensor package into the plane. A current carrying structure is positioned proximate to the flux guide and circuitry is coupled to the current carrying structure. The circuitry is configured to concurrently provide an electric current to each of the parallel conductive segments in order to apply a magnetic field to the flux guide.

For a magnetic field sensor that includes an in-plane sense element and a flux guide configured to direct a magnetic field oriented perpendicular to a plane of the magnetic field sensor into said plane, an embodiment of a method comprises forming a continuous coil structure proximate to the flux guide and providing circuitry coupled to the continuous coil structure. The circuitry is configured to provide an electric current to an input of the continuous coil structure in order to apply a magnetic field to the flux guide.

An embodiment of a method of reconditioning a flux guide in a magnetic field sensor comprises providing a current carrying structure positioned proximate to a flux guide in a magnetic field sensor. The current carrying structure includes multiple substantially parallel conductive segments. The method further comprises providing an electric current at an input of the current carrying structure. The electric current generates a magnetic field, and the electric current is provided for a duration sufficient to reach a steady state flow of the electric current through the conductive segments to apply the magnetic field concurrently to substantially an entirety of a length of said flux guide. The magnetic field has a magnetic flux density magnitude that is sufficient to recondition a magnetic polarization of said flux guide.

While the principles of the inventive subject matter have been described above in connection with specific apparatus and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently so that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A sensor package comprising:
   a magnetic field sensor, said magnetic field sensor including an in-plane sense element and a flux guide configured to direct a magnetic field oriented perpendicular to a plane of said magnetic field sensor into said plane;
   a current carrying structure positioned proximate to said flux guide, said current carrying structure including a continuous coil having multiple substantially parallel conductive segments connected by additional conductive segments oriented perpendicular to said parallel conductive segments to form a continuous series of loops, wherein said parallel conductive segments of said continuous coil are arranged adjacent to one another, and said parallel conductive segments are oriented substantially perpendicular to a length of said flux guide; and
   circuitry coupled to said current carrying structure, said circuitry being configured to provide an electric current to said continuous coil such that said electric current flows through each of said parallel conductive segments, wherein said continuous coil includes a subset of adjacent ones of said parallel conductive segments for which said electric current flows in the same direction, said subset of adjacent ones of said parallel conductive segments are in proximity to said flux guide, said electric current generates a magnetic field, and said magnetic field is applied to said flux guide to recondition a magnetic polarization of said flux guide.

2. A sensor package as claimed in claim 1 wherein said current carrying structure is vertically displaced from said flux guide.

3. A sensor package as claimed in claim 1 wherein said current carrying structure is positioned within a distance of five microns from said flux guide.

4. A sensor package as claimed in claim 1 wherein said current comprises a direct current (DC) waveform.

5. A sensor package as claimed in claim 1 wherein said current is configured to generate said magnetic field such that a vector component of said magnetic field in a direction substantially parallel to a length of said flux guide exceeds a minimum threshold level of magnetic flux density.

6. A sensor package as claimed in claim 5 wherein said minimum threshold level is at least thirty Gauss.

7. A sensor package as claimed in claim 1 wherein when a flow of said electric current through said continuous coil reaches steady state, said magnetic field is applied concurrently to substantially an entirety of a length of said flux guide.

8. A sensor package as claimed in claim 1 wherein said continuous coil is a first continuous coil, and said current carrying structure further includes a second continuous coil positioned adjacent to said flux guide, said second continuous coil being connected in series with said first continuous coil.

9. A sensor package as claimed in claim 8 wherein said first and second continuous coils are formed in a common structural layer vertically displaced from said flux guide.

* * * * *